HIGH-FREQUENCY WAVE-SIGNAL TUNING DEVICE

Filed April 20, 1950 2 Sheets-Sheet 1

INVENTOR.
CHARLES J. HIRSCH
MEYER PRESS

BY Laurence B. Dodds

ATTORNEY

HIGH-FREQUENCY WAVE-SIGNAL TUNING DEVICE

Filed April 20, 1950 2 Sheets-Sheet 2

INVENTOR.
CHARLES J. HIRSCH
MEYER PRESS

BY Laurence B. Dodds

ATTORNEY

United States Patent Office 2,735,015

Patented Feb. 14, 1956

2,735,015

HIGH-FREQUENCY WAVE-SIGNAL TUNING DEVICE

Charles J. Hirsch, Douglaston, and Meyer Press, Flushing, N. Y., assignors to Hazeltine Research, Inc., Chicago, Ill., a corporation of Illinois Application April 20, 1950, Serial No. 157,058

4 Claims. (Cl. 250—40)

*General*

Figure 2:
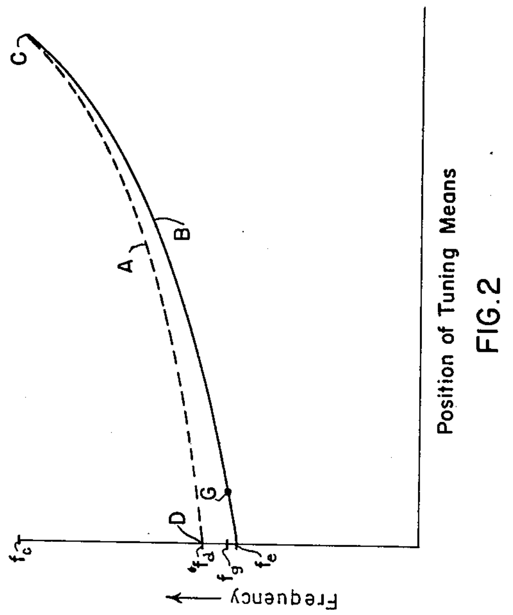

The present invention relates to high-frequency wave-signal tuning devices and, more particularly, to such devices in which the effective electrical length of the wave guide thereof is altered by tuning means displaceable relative to the wave guide to effect tuning over a selected range of frequencies. The invention is especially directed to a tuning device which provides for two such wave guides having desired tuning characteristics to effect tracking thereof.

In a conventional low-frequency superheterodyne wave-signal receiver adapted to receive wave signals in the amplitude-modulation band, it is well appreciated that tracking local oscillator and mixer stages may be accomplished over a wide frequency range by utilizing auxiliary trimmer condensers coupled to the main tuning condensers. However, in high-frequency wave-signal receivers having tuning devices which utilize wave guides as tuned circuits, such low-frequency tracking methods are not entirely practical and various systems have been devised effectively to accomplish tracking of the tuned circuits. Prior systems have employed condenser plates of preselected shapes for insertion in the wave guides to provide desired tuning characteristics therefor. Some such systems, in which the condenser plates for two wave guides are mounted on the same shaft, require bending of the plates to provide accurate tracking of the tuned circuits. Other such systems in which the condenser plates for the two wave guides are mounted on different shafts employ adjustable cam mechanisms for adjusting the relative angular positions of the shafts. Although these prior systems have proven useful, they have been somewhat unsatisfactory in that each presents difficulty in alignment or complexity of structure.

It is an object of the present invention, therefore, to provide a new and improved high-frequency wave-signal tuning device which avoids one or more of the above-mentioned disadvantages of prior such systems.

It is another object of the invention to provide a relatively simple high-frequency wave-signal tuning device which may be readily adjusted to procure a desired tuning characteristic.

It is a further object of the invention to provide an improved high-frequency wave-signal tuning device which provides unicontrol tuning means for two tuned wave guides and may be easily aligned to provide tracking thereof.

In accordance with a particular form of the invention, a high-frequency wave-signal tuning device tunable over a selected frequency range comprises a high-frequency wave-signal transmission line substantially short-circuited at a fixed first point therealong. The device also includes tuning means longitudinally displaceable along the transmission line substantially short-circuiting the same at a displaceable second point therealong for selectively tuning the transmission line to substantially an integral multiple of one-quarter wave length greater than one-quarter wave length at each frequency in the range. The tuning device also includes a high-frequency trimmer condenser included in the transmission line within a portion thereof resonant at the highest frequency in the range and displaced from the short-circuited first point and nearer the first point than the second point when the device is tuned to the high and low ends of the frequency range for imparting to the device a desired frequency-displacement tuning characteristic over the high end of the frequency range.

For a better understanding of the present invention, together with other and further objects thereof, reference is had to the following description taken in connection with the accompanying drawings, and its scope will be pointed out in the appended claims.

Figure 1:
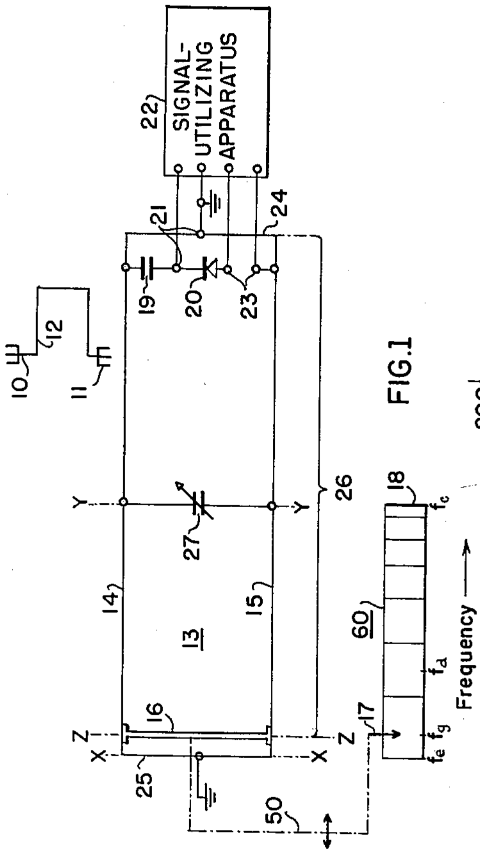
Figure 4:
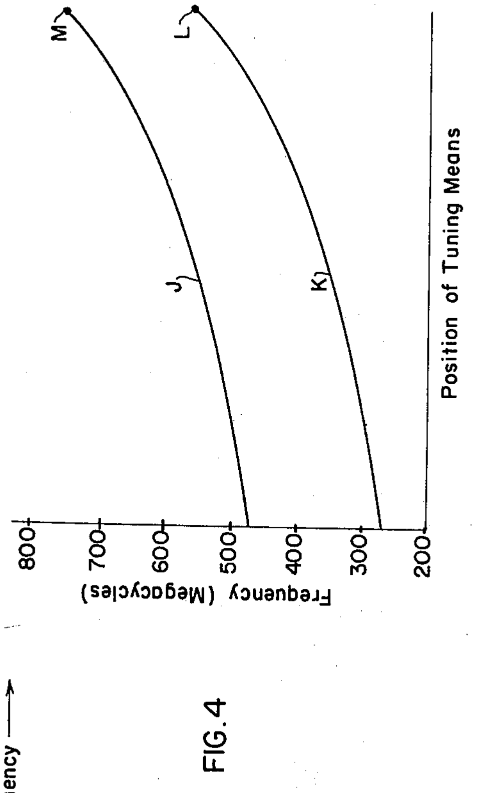
Figure 3:
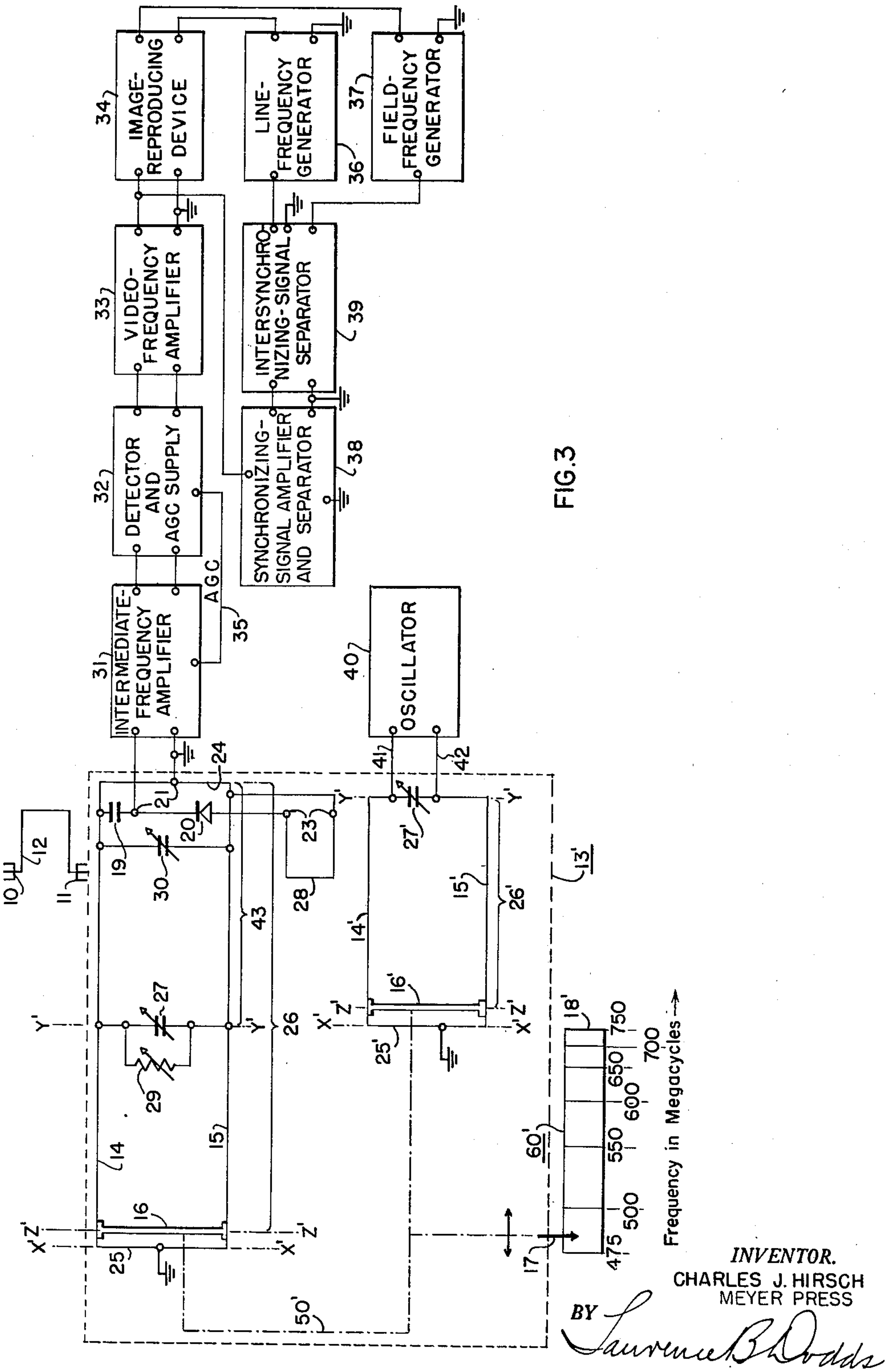

In the accompanying drawings, Fig. 1 is a circuit diagram, partly schematic, of a high-frequency wave-signal receiving system including a tuning device in accordance with a particular form of the invention; Fig. 2 is a graph utilized in explaining the operation of the tuning device of the Fig. 1 receiver; Fig 3 is a circuit diagram, partly schematic, of a complete television receiver including another form of tuning device in accordance with the invention; and Fig. 4 is a graph utilized in explaining the operation of the tuning device of the Fig. 3 receiver.

Referring now more particularly to Fig. 1 of the drawings, the high-frequency wave-signal receiving system there represented comprises an antenna system 10, 11 and a coupling loop 12 coupled to a high-frequency wave-signal tuning device 13 comprising a resonant transmission line which includes conductors 14, 15. The tuning device 13 includes a movable tuning means 16 which is mechanically coupled by a suitable means represented by the dot-dash line 50 to an indicator 17 of a frequency-indicating device 60 having a scale 18 graduated in terms of frequency. The tuning device 13 is constructed in accordance with the invention and will subsequently be described in greater detail.

A frequency-converter system including a condenser 19 and crystal mixer 20 is coupled to the tuning device 13 in a conventional manner and preferably at a position on the transmission line 14, 15 selected to procure an impedance match between the transmission line 14, 15 and the frequency-converter system 19, 20. The condenser 19 is coupled through a pair of output terminals 21, 21 to a conventional signal-utilizing apparatus 22 of the superheterodyne type which may include coupled in cascade and in the order named, an intermediate-frequency amplifier of one or more stages, a detector, an audio-frequency amplifier of one or more stages and a loudspeaker. The signal-utilizing apparatus 22 may also include a local oscillator coupled to a pair of input terminal 23, 23 of the mixer 20. The antenna system 10, 11, the coupling loop 12, the frequency-indicating device 60, the frequency-converter system 19, 20 and the signal-utlizing apparatus 22 may all be of conventional construction and operation so that a detailed description of the operation thereof is unnecessary.

Considering briefly, however, the general operation of the above-described receiver as a whole, wave signals intercepted by the antenna system 10, 11 are translated through the coupling loop 12 to the tuning device 13. By adjustment of the tuning means 16, the tuning device 13 is caused to resonate at the frequency of a selected wave signal which is indicated by the frequency-indicating device 60. Adjustment of the local oscillator of the signal-utilizing apparatus 22 causes the apparatus 22 to provide for the mixer 20 at input terminals 23, 23 a heterodyne wave signal which beats with the received wave signal in the frequency-converter system 19, 20. Through the conventional heterodyne action of the frequency-converter system 19, 20, an intermediate-frequency signal is developed across output terminals 21, 21 and applied to the signal-utilizing apparatus 22 wherein it is amplified by the intermediate-frequency amplifier and detected by the detector. The derived modulation components are amplified by the audio-frequency amplifier and applied to the loud-speaker which converts those components to sound.

*Description of Fig. 1 tuning device*

Referring now more particularly to the tuning device 13 which embodies the present invention, the device is tunable to each of a plurality of frequencies within a selected range of frequencies and comprises a wave guide which may be in the form of a transmission line including the pair of parallel conductors 14, 15 short-circulited at each end thereof by conductors 24 and 25. The transmission line 14, 15 has an effective electrical length approximately equal to an integral multiple of one-quarter wave length at the lowest frequency within the selected range. As used throughout this specification and the claims, the term integral multiple is employed in its usual sense and is also meant to include the product obtained by utilizing unity as a multiplication factor. The effective electrical length of the transmission line 14, 15 preferably is approximately equal to one-half wave length at the lowest frequency within the selected range. The tuning means 16 for the tuning device 13 is effective to provide a low-impedance termination for the transmission line 14, 15 and ordinarily is displaceable longitudinally of the conductors 14, 15 over a limited distance from a position X—X to a position Y—Y. The positions X—X and Y—Y are chosen with reference to the selected frequency range. The position X—X usually is selected as the position of the tuning means 16 which provides for the transmission line 14, 15 a maximum effective electrical length. The position Y—Y is selected as the position of the tuning means 16 which provides for the transmission line 14, 15 resonance preferably at the highest frequency in the selected range. Accordingly, the position Y—Y of the tuning means 16 provides for the transmission line 14, 15 a minimum effective electrical length. The tuning means 16 selectively adjusts the effective electrical length of the transmission line at each position of adjustment of the tuning means to substantially the aforesaid multiple of one-quarter wave length of each of the plurality of frequencies within the selected range. Accordingly, the tuning means 16 at each position of adjustment thereof selectively adjusts the effective electrical length of the transmission line preferably to substantially one-half wave length at each of the plurality of frequencies within the selected range. The transmission line 14, 15 includes a resonant portion 26 having a desired physical length at a selected position of adjustment Z—Z of the tuning means. This selected position of adjustment Z—Z is preferably a position of adjustment which provides for the resonant portion 26 a long physical length and may coincide with the position of adjustment X—X.

The tuning device also includes reactive impedance means comprising a condenser 27 which is preferably adjustable and is coupled to the transmission line 14, 15 at a position corresponding substantially to that position Y—Y of the tuning means which provides for the transmission line a minimum effective electrical length as previously mentioned. The condenser 27 has a value of capacitive reactance so selected at a frequency within the selected range that the resonant portion 26 has a desired effective electrical length at the last-mentioned frequency. The value of capacitive reactance of condenser 27 is proportioned preferably at that frequency in the selected range at which it is desired that the portion 26 resonate. Hence, the value of capacitive reactance of condenser 27 is so selected at the last-mentioned frequency that the resonant portion 26 has a desired effective electrical length preferably equal to substantially one-half wave length at the last-mentioned frequency.

*Operation of Fig. 1 tuning device*

The operation of the tuning device represented in Fig. 1 and the results obtained thereby may be best understood by reference to Fig. 2 of the drawings. Curve A of Fig. 2, shown in broken-line construction, represents the tuning characteristic of the tuning device 13 under an assumed condition in which condenser 27 is not coupled thereto. Curve B of Fig. 2, shown in solid-line construction, represents the tuning characteristic of the tuning device 13 when it includes the condenser 27 coupled to the transmission line 14, 15 and having a selected value of impedance as mentioned above.

Assuming for the moment that condenser 27 is not coupled to the tuning device 13, adjustment of the tuning means 16 to that position of adjustment Y—Y which provides for the transmission line 14, 15 a minimum effective electrical length causes the transmission line 14, 15 to resonate at the highest frequency in the selected range. That corresponds to a frequency of $f_c$ represented as point C on curve A. The indicator 17 is mechanically aligned with the tuning means 16 preferably in the position of adjustment Y—Y to indicate a frequency of $f_c$ Thereafter, adjustment of the tuning means 16 to the position of adjustment X—X provides resonance for the transmission line 14, 15 at approximately the maximum frequency within the selected range as represented by a frequency of $f_d$ megacycles at point D on curve A. However, it may be that frequency indicator 17 indicates a frequency of $f_e$ as corresponding to the maximum wave length within the selected range of wave length. Hence, it is desirable so to modify the tuning characteristic A of the tuning device 13 as to provide for the transmission line 14, 15 at the position of adjustment X—X of the tuning means 16 a resonant frequency of $f_e$.

Assume now that the condenser 27 is coupled to the transmission line 14, 15 at a position corresponding substantially to that position Y—Y of the tuning means 16 which provides for the transmission line 14, 15 a minimum effective electrical length. The value of impedance of condenser 27 is preferably selected by adjusting the tuning means 16 to the position of adjustment Z—Z and providing for the transmission line 14, 15 an input signal having a frequency at which it is desired that the portion 26 resonate. This is indicated by a corresponding frequency of $f_g$ megocycles on the frequency-indicating device 60 and as point G on curve B of Fig. 2. The value of impedance of condenser 27 is selected and then left at that value so that the portion 26 is resonant at the last-mentioned frequency of $f_g$ megacycles. Accordingly, the modified tuning characteristic of the transmission line 14, 15 is then represented by curve B. Since the tuning means 16 presents a low-impedance termination for the tuning device 13 with the tuning means in the position of adjustment Y—Y, the condenser 27 is substantially short-circuited and is ineffective substantially to alter the minimum effective electrical length of the tuning device. Accordingly, it may be seen from curve B that the impedance of condenser 27 greatly alters the longer effective electrical lengths provided for the transmission line 14, 15 by the tuning means 16 but effects substantially less the shorter effective electrical lengths provided for the transmission line 14, 15 by the tuning means 16. It may also be seen from curve B that displacements of the tuning means cause the selected effective electrical lengths of the transmission line 14, 15 to alter in a desired manner such that substantially the resonant frequency of the transmission line 14, 15 at each position of adjustment of the tuning means 16 is indicated by the frequency-indicating device 60.

*General description of Fig. 3 receiver*

Referring now to Fig. 3 of the drawings, there is represented a complete television receiver including a tuning device embodying the invention in a modified form which is generally similar to that represented in Fig. 1, corresponding elements being designated by the same reference numerals and similar elements by the same reference numerals primed. The television receiver there represented preferably is adapted to receive wave signals in the ultra-high-frequency band. The receiver comprises an antenna system 10, 11 and a coupling loop 12 coupled to a tuning device 13' including tuned transmission lines 14, 15 and 14', 15', each of which is generally similar to the transmission line 14, 15 of the Fig. 1 embodiment and will be more fully described hereinafter. The tuning device 13' also includes tuning means 16, 16' which is mechanically connected to a frequency-indicating device 60' similar to the corresponding device of the Fig. 1 embodiment and having an indicator 17 and scale 18' graduated in terms of frequency.

A frequency-converter system 19, 20 is coupled in a conventional manner to the transmission line 14, 15. The frequency-converter system 19, 20, which includes output terminals 21, 21, is coupled in cascade and in the order named to an intermediate-frequency amplifier 31 of one or more stages, a detector and automatic-gain-control (A. G. C.) supply 32, a video-frequency amplifier 33 of one or more stages and an image-reproducing device 34 which may comprise a cathode-ray tube. The intermediate-frequency amplifier 31 preferably is tuned to an intermediate frequency of, for example, 200 megacycles. The A. G. C. supply circuit of unit 32 is connected to the input circuits of one or more stages of the intermediate-frequency amplifier 31 by a control circuit conductor 35.

The output circuit of the video-frequency amplifier 33 is coupled to the input circuit of a line-frequency generator 36 and a field-frequency generator 37 through a synchronizing-signal amplifier and separator 38 and an intersynchronizing-signal separator 39. The output circuits of the generators 36 and 37 are coupled in a conventional manner to scanning coils of the cathode-ray tube 34.

The television receiver also includes an oscillator 40 coupled by circuit conductors 41, 42 to the tuned transmission line 14', 15'. The tuned circuit of the oscillator 40 comprises the transmission line 14', 15', the tuning means 16', conductors 41, 42 and other components of the oscillator associated therewith. The transmission line 14', 15' is coupled to input terminals 23, 23 of the frequency-converter system 19, 20 through a coupling loop 28. The antenna system 10, 11 coupling loops 12, 28, frequency-indicating device 60', frequency-converter system 19, 20 and units 31–40, inclusive, may be of conventional construction and operation so that a detailed description and explanation of the operation thereof are unnecessary herein.

*General operation of Fig. 3 receiver*

Considering briefly, however, the general operation of the above-described receiver as a whole, television signals intercepted by the antenna system 10, 11 are selected by the transmission line 14, 15 and are supplied to the frequency-converter system 19, 20. The oscillator 40 through the operation of the transmission line 14', 15' provides for the frequency-converter system 19, 20 a signal for heterodyning with the received television signals. In the frequency converter 19, 20 the television signals are converted to intermediate-frequency 200-megacycle signals. The latter in turn are selectively amplified in the intermediate-frequency amplifier 31 and delivered to the detector and automatic-gain-control supply 32. The modulation components of the signals are derived by the detector 32 and are supplied to the video-frequency amplifier 33 wherein they are amplified and from which they are applied to the input circuit of the cathode-ray tube 34. A control voltage derived by the automatic-gain-control supply of unit 32 is applied as an automatic-amplification-control bias to the gain-control circuits of the intermediate amplifier 31 to maintain the signal input to the detector of unit 32 within a relatively narrow range for a wide range of received signal intensities. Unit 38 selects the synchronizing signals from the other modulation components of the composite television signal applied thereto by the video-frequency amplifier 33. The line-synchronizing and field-synchronizing signals derived by the separator 38 are separated from each other by unit 39 and are then supplied to individual ones of the generators 36 and 37 to synchronize the operation thereof. Saw-tooth current waves are generated in the line-frequency and field-frequency generators 36 and 37 and are applied to the scanning coils of the cathode-ray tube 34, thereby to deflect the cathode-ray beam of the tube 34 in two directions normal to each other to trace a rectilinear scanning pattern on the screen of the tube and thereby reconstruct the translated picture.

*Description of Fig. 3 tuning device*

Referring now more particularly to that portion of the receiver embodying the invention, a high-frequency wave-signal tuning device 13' is tunable to each of a plurality of frequencies within two selected frequency ranges and comprises a first wave guide which is preferably the transmission line including a pair of parallel conductors 14, 15 short-circuited at each end thereof by conductors 24 and 25. The transmission line 14, 15 has an effective electrical length approximately equal to an integral multiple of one-quarter wave length at the lowest frequency within one of the selected ranges. In the Fig. 3 embodiment, the effective electrical length of the transmission line 14, 15 is approximately equal to one-half wave length at the lowest frequency within the aforesaid one of the selected ranges.

The tuning device 13' includes a second wave guide which is preferably the transmission line including a pair of parallel conductors 14', 15' short-circuited at one end thereof by a conductor 25'. The transmission line 14', 15' has an effective electrical length approximately equal to an integral multiple of one-quarter wave length at the lowest frequency within the other of the selected ranges. Preferably, the effective electrical length of the transmission line 14', 15' is approximately equal to one-quarter at the lowest frequency wave length within the aforesaid other of the selected ranges.

The tuning device also includes tuning means comprising elements 16 and 16' which are effective to provide movable low-impedance terminations for the transmission lines 14, 15 and 14', 15' respectively. The elements 16 and 16' of the tuning means ordinarily are mechanically interconnected for unicontrol operation as represented by the dash-dot line 50' and are displaceable relative to each of the transmission lines. Element 16 is preferably displaceable longitudinally of the conductors 14, 15 from a position X'—X' to a position Y'—Y' for selectively adjusting the effective electrical length of the transmission line 14, 15 at each position of adjustment of the tuning means to substantially the first-mentioned multiple of one-quarter wave length at each of the plurality of frequencies within the aforesaid one of the selected ranges. Thus element 16 at each position of adjustment thereof selectively adjusts the effective electrical length of the transmission line 14, 15 preferably to substantially one-half wave length at each of the plurality of frequencies within the aforesaid one range.

Element 16' is displaceable longitudinally of the conductors 14', 15' from a position X'—X' to a position Y'—Y', corresponding, respectively, to positions X'—X' and Y'—Y' of element 16, for selectively adjusting the effective electrical length of the transmission line 14', 15' at each position of adjustment of the tuning means to substantially the last-mentioned multiple of one-quarter wave length at each of the plurality of frequencies within the aforesaid other selected range. At each position of adjustment of the tuning means element 16' selectively adjusts the effective electrical length of the transmission line 14′, 15′ preferably to substantially one-quarter wave length at each of the plurality of frequencies within the aforesaid other selected range.

The second transmission line 14′, 15′ includes a resonant portion 26′ having a desired physical length at a selected position of adjustment Z′—Z′ of the tuning means. This selected position of adjustment Z′—Z′ is preferably a position of adjustment which provides for the resonant portion 26′ a long physical length and may coincide with the position of adjustment X′—X′. The first transmission line 14, 15 includes a resonant portion 26 at the above-mentioned first selected position of adjustment Z′—Z′ and includes a different resonant portion 43 at a second selected position of adjustment of the tuning means which is preferably the position Y′—Y′. The two last-mentioned resonant portions of the first transmission line 14, 15 have substantially different and desired physical lengths.

The tuning device 13′ also includes a first reactive impedance means 27′ coupled to the second transmission line 14′, 15′ at a position corresponding substantially to the position Y′—Y′ of the tuning means which provides for the transmission line 14′, 15′ a minimum effective electrical length. The condenser 27′ has a value of capacitive reactance so selected at a frequency within the aforesaid other range of frequencies that the resonant portion 26′ has a desired effective electrical length at the last-mentioned frequency. The value of capacitive reactance of the condenser 27′ is selected preferably at that frequency in the aforesaid other range at which it is desired that the portion 26′ resonate. Hence the value of capacitive reactance of condenser 27′ is so selected at the last-mentioned frequency that the resonant portion 26′ has a desired effective electrical length preferably equal to substantially one-quarter wave length at the last-mentioned frequency.

The tuning device 13′ also includes a second reactive impedance means comprising a condenser 27 and further includes a parallel-connected resistor 29. The condenser 27 and the resistor 29 are coupled to the first transmission line 14, 15 at a position corresponding substantially to that position Y′—Y′ of the tuning means which provides for the transmission line 14, 15 a minimum effective electrical length. The value of impedance of the condenser 27 is so selected at a first frequency within the aforesaid one range of frequencies that the one of the resonant portions 26 and 43 having the longer physical length, namely portion 26, has a desired effective electrical length at the aforesaid first frequency in the selected one range. Accordingly, the value of impedance of the condenser 27 is preferably selected at a frequency within the selected one range at which it is desired that the portion 26 resonate. Hence, the value of impedance of condenser 27 is ordinarily so selected at the last-mentioned frequency that the portion 26 has an effective electrical length substantially equal to one-half wave length at the last-mentioned frequency. The value of resistor 29 may be so selected as to provide for output signals of the tuning device 13′ a substantially uniform amplitude-frequency response characteristic over the selected one range of frequencies. For many applications the resistor 29 may be omitted.

The tuning device 13′ also includes a third reactive impedance means comprising a condenser 30 which is coupled to the transmission line 14, 15 at a position within the resonant portion 43 of the transmission line 14, 15 provided by the tuning means 16, 16′ at the position of adjustment Y′—Y′ and preferably at a point of higher potential when the device is tuned to the high end of the frequency range than when the device is tuned to the low end of the frequency range for imparting to the device a desired frequency-displacement tuning characteristic over the high end of the frequency range. As represented in Fig. 3, the condenser 30 is displaced from a short-circuited fixed first point along the transmission line (short-circuiting element 24) and is nearer to the first point than to a short-circuited displaceable second point (tuning means 16) when the device is tuned to the high and low ends of the frequency range. The condenser 30 has a value of impedance so selected at a second frequency within the aforesaid one range that the other of the two resonant portions 26 and 43 having the shorter physical length, namely portion 43, has a desired effective electrical length at the second frequency in the aforesaid one range. The value of capacitive reactance of condenser 30 is selected preferably at that frequency at which it is desired that the portion 43 resonate. Hence, the value of capacitive reactance of condenser 30 is so selected at the last-mentioned frequency that the resonant portion 43 has a desired effective electrical length preferably equal to substantially one-half wave length at the last-mentioned frequency.

*Operation of Fig. 3 tuning device*

The operation of the tuning device represented in Fig. 3 and the results obtained thereby may be best understood by reference to Fig. 4 of the drawings. For the purpose of this explanation it may be assumed that resistor 29 has an infinite value of impedance. Curves J and K of Fig. 4 then represent the tuning characteristics of the transmission lines 14, 15 and 14′, 15′, respectively. Adjustment of the tuning means 16, 16′ to that position of adjustment Y′—Y′ which provides for the transmission line 14′, 15′ a minimum effective electrical length causes the transmission line 14′, 15′ to resonate at the shortest frequency within the aforesaid other range. When the tuning means 16, 16′ is in the position of adjustment Y′—Y′, conductors 41 and 42 and components of oscillator 40 associated therewith provide for the transmission line 14′, 15′ resonance at the last-mentioned frequency. That corresponds to a frequency of say 550 megacycles represented as point L on curve K. The indicator 17 is mechanically aligned with the tuning means 16, 16′ preferably in the position of adjustment Y′—Y′ to indicate a frequency of 750 megacycles which is 200 megacycles above the resonant frequency of the transmission line 14′, 15′. Adjustment of the tuning means 16, 16′ to the position of adjustment X′—X′ then provides for the transmission line 14′, 15′ resonance at approximately the maximum frequency within the aforesaid selected other range of frequencies. It may be seen that the indicator 17 indicates a frequency at 475 megacycles as corresponding to the maximum frequency within the above-mentioned selected one range of frequencies. Hence, it is desirable to provide for the transmission line 14′, 15′ at the position of adjustment X′—X′ of the tuning means 16, 16′ a resonant frequency of 275 megacycles.

The value of impedance of condenser 27′ is preferably selected by adjusting the tuning means 16, 16′ to the position of adjustment Z′—Z′ and providing for the transmission line 14′, 15′ an input signal having a frequency at which it is desired that the portion 26′ resonate. The value of impedance of condenser 27′ ordinarily is so selected that the portion 26′ is resonant at the last-mentioned frequency. It may then be seen from curve K that displacements of the tuning means cause the selected effective electrical lengths of the transmission line 14′, 15′ to alter in a desired manner such that in each position of adjustment of the tuning means the frequency-indicating device 60′ indicates a frequency substantially 200 megacycles above the resonant frequency of the transmission line 14′, 15′.

The tuning means 16, 16′ is then preferably adjusted to the position of adjustment Y′—Y′. With the tuning means 16, 16′ in the position of adjustment Y′—Y′, the value of impedance of condenser 30 is so selected at the aforesaid second frequency within the above-mentioned selected one range of frequencies that the resonant portion 43 has a desired effective electrical length at the last-mentioned frequency. Accordingly, the value of impedance of condenser 30 may be selected at that frequency at which it is desired that the portion 43 resonate. That frequency is indicated by a corresponding frequency of 750 megacycles on the frequency-indicating device 60′ and as point M on curve J. The value of impedance of condenser 30 preferably is so selected that the portion 43 is resonant at 750 megacycles.

The tuning means 16, 16′ may then be adjusted to the position of adjustment Z′—Z′. Accordingly, the value of condenser 27 preferably is selected at that frequency in the aforesaid selected one range of frequencies at which it is desired that the portion 26 resonate. Selection of the value of impedance of condenser 27 is accomplished in a manner substantially the same as the selection of the value of impedance of the corresponding condenser in the Fig. 1 embodiment. After the value of impedance of condenser 27 has been properly selected, due to practical limitations in the accuracy of initial adjustments it may be necessary to repeat portions of the foregoing alignment procedure as is customary in the alignment of low-frequency tuning devices. It may be seen from curves J and K of Fig. 4 that when the values of impedance of the above-mentioned condensers 27, 27′ and 30 have been properly selected, displacements of the tuning means 16, 16′ cause the selected effective electrical lengths of the first transmission line 14, 15 to alter in a desired manner with corresponding changes in the selected effective electrical lengths of the second transmission line 14′, 15′ such that resonant frequencies of the two transmission lines differ by substantially the intermediate frequency of 200 megacycles at each position of adjustment of the tuning means 16, 16′. Accordingly, at each position of adjustment of the tuning means 16, 16′ the transmission lines 14, 15 and 14′, 15′ supply for the frequency-converter system 19, 20 wave signals differing in frequency by substantially the intermediate frequency. The frequency-converter system 19, 20 thereby derives a desired intermediate-frequency signal.

From the foregoing description of the invention it will be apparent that a tuning device 13′ embodying the invention has the advantage that unicontrol tuning means 16, 16′ provides for the transmission lines 14, 15 and 14′, 15′ desired tuning characteristics. The tuning device has the further advantage that it is readily adjustable to provide tracking of the two tuned transmission lines.

While there have been described what are at present considered to be the preferred embodiments of this invention, it will be obvious to those skilled in the art that various changes and modifications may be made therein without departing from the invention, and it is, therefore, aimed to cover all such changes and modifications as fall within the true spirit and scope of the invention.

What is claimed is:

1. A high-frequency wave-signal tuning device tunable over a selected frequency range comprising: a high-frequency wave-signal transmission line substantially short-circuited at a fixed first point therealong; tuning means longitudinally displaceable along said transmission line and substantially short-circuiting the same at a displaceable second point therealong for selectively tuning said transmission line to substantially an integral multiple of one-quarter wave length greater than one-quarter wave length at each frequency in said range; and a high-frequency trimmer condenser included in said transmission line within the portion thereof resonant at the highest frequency in said range and displaced from said short-circuited first point and nearer said first point than said second point when the device is tuned to the high and low ends of said frequency range for imparting to the device a desired frequency-displacement tuning characteristic over said high end of said frequency range.

2. A high-frequency wave-signal tuning device tunable over a selected frequency range comprising: a high-frequency wave-signal transmission line substantially short-circuited at a fixed first point therealong; tuning means longitudinally displaceable along said transmission line and substantially short-circuiting the same at a displaceable second point therealong for selectively tuning said transmission line to substantially an integral multiple of one-quarter wave length greater than one-quarter wave length at each frequency in said range; and a high-frequency trimmer condenser included in said transmission line within the portion thereof resonant at the highest frequency in said range and displaced from said short-circuited first point and nearer said first point than said second point when the device is tuned to the high and low ends of said frequency range and at a point of higher potential when the device is tuned to the high end of said frequency range than when the device is tuned to the low end of said frequency range for imparting to the device a desired frequency-displacement tuning characteristic over said high end of said frequency range.

3. A high-frequency wave-signal tuning device tunable over a selected frequency range comprising: a high-frequency wave-signal transmission line substantially short-circuited at a fixed first point therealong; a first low-frequency trimmer condenser included in said transmission line at approximately the high-frequency position of said tuning means for imparting to the device a desired frequency-displacement tuning characteristic primarily over the low end of said frequency range; tuning means longitudinally displaceable along said transmission line and substantially short-circuiting the same at a displaceable second point therealong for selectively tuning said transmission line to substantially an integral multiple of one-quarter wave length greater than one-quarter wave length at each frequency in said range; and a second high-frequency trimmer condenser included in said transmission line within the portion thereof resonant at the highest frequency in said range and displaced from said short-circuited first point and nearer said first point than said second point when the device is tuned to the high and low ends of said frequency range for imparting to the device a desired frequency-displacement tuning characteristic primarily over said high end of said frequency range, said condensers being jointly effective to impart to the device a desired frequency-displacement tuning characteristic over substantially said entire frequency range.

4. A high-frequency wave-signal tuning device tunable over a selected frequency range comprising: first and second high-frequency wave-signal transmission lines, said first transmission line being substantially short-circuited at a fixed point therealong; unicontrol tuning means longitudinally displaceable along said transmission lines and substantially short-circuiting the same at a displaceable point along each thereof for selectively tuning said first transmission line to substantially an integral multiple of one-quarter wave length greater than one-quarter wave length at each frequency in said range and for selectively and simultaneously tuning said second transmission line to a different frequency; a first low-frequency trimmer condenser included in said second transmission line at approximately the high-frequency position of said tuning means for imparting to said second transmission line a desired frequency-displacement tuning characteristic primarily over the low end of the tuning range thereof; and a second high-frequency trimmer condenser included in said first transmission line within the portion thereof resonant at the highest frequency in said frequency range and displaced from said short-circuited fixed point and nearer said fixed point than said displaceable point when the device is tuned to the high and low ends of said frequency range for imparting to the device a desired frequency-displacement tuning characteristic primarily over said high end of said frequency range, said condensers being jointly effective to maintain the difference between the resonant frequencies of said transmission lines substantially constant over substantially said entire frequency range of the device.

(References on following page)

References Cited in the file of this patent

UNITED STATES PATENTS

| | | |
|---|---|---|
| 2,112,822 | Braden | Apr. 5, 1938 |
| 2,262,365 | Kinn | Nov. 11, 1941 |
| 2,292,254 | Van Beuren | Aug. 4, 1942 |
| 2,311,522 | Conron et al. | Feb. 16, 1943 |
| 2,326,801 | Pray et al. | Aug. 17, 1943 |
| 2,415,141 | Malling | Feb. 4, 1947 |
| 2,551,228 | Achenbach | May 1, 1951 |
| 2,566,050 | Wolf | Aug. 28, 1951 |
| 2,573,517 | Van Weel | Oct. 30, 1951 |
| 2,627,579 | Wasmansdorff | Feb. 3, 1953 |